United States Patent [19]
Eisenhofer et al.

[11] Patent Number: 6,108,494
[45] Date of Patent: Aug. 22, 2000

[54] OPTIMIZING RUNTIME COMMUNICATION PROCESSING BETWEEN SIMULATORS

[75] Inventors: Karl Eisenhofer, San Jose; Arun T. Venkatachar, Sunnyvale; Kevin Nazareth, Scotts Valley; Peter Odryna, Santa Cruz, all of Calif.; Robert Michael Bradley, Raleigh, N.C.

[73] Assignee: Mentor Graphics Corporation, Wilsonville, Oreg.

[21] Appl. No.: 09/139,215

[22] Filed: Aug. 24, 1998

[51] Int. Cl.$^7$ ...................................................... G06F 9/455
[52] U.S. Cl. .................................. 395/500.35; 395/500.06
[58] Field of Search ......................... 702/60; 395/500.02, 395/500.05, 500.06, 500.08, 500.34, 500.35, 500.36, 500.4, 500.41

[56] References Cited

U.S. PATENT DOCUMENTS

| | | | |
|---|---|---|---|
| 5,668,732 | 9/1997 | Khouja et al. | 702/60 |
| 5,838,947 | 11/1998 | Sarin | 395/500.35 |
| 5,896,300 | 4/1999 | Raghavan et al. | 395/500.11 |
| 5,920,485 | 7/1999 | Mangelsdorf | 395/500.37 |

OTHER PUBLICATIONS

Yoshida et al., *A Parallel Implementation of Large–Scale Circuit Simulation,* Aug. 1988, pp. 321–324.

*Primary Examiner*—Kevin J. Teska
*Assistant Examiner*—Dan Fiul
*Attorney, Agent, or Firm*—Blakely Sokoloff Taylor & Zafman, LLP

[57] ABSTRACT

An optimization mechanism for increasing runtime performance in a co-/ multi-simulation environment by reducing the number of connections between simulators is provided. A simulation backplane includes netlist optimization logic that analyzes the netlists of design partitions and employs a set of rules to reduce the number of connections among simulators participating in a simulation session. According to one aspect of the present invention, synchronizations among a first solver and one or more other solvers that are simulating a design of a system or a portion thereof are limited to situations in which simulation being performed by each of the one or more other solvers is dependent upon event information from the first solver. Partitioned design source information is received for each a plurality of solvers. Based upon the partitioned design source information, partition dependency information is generated. The partition dependency information includes information from which it may be verified whether or not one design partition is dependent upon an event from another design partition. Each of the plurality of solvers concurrently simulate the design by acting on a partition of the design. Responsive to event information provided by a first solver of the plurality of solvers, one or more other solvers are synchronized based upon the partition dependency information.

4 Claims, 8 Drawing Sheets

| | SOLVER 1 | SOLVER 2 | OPTIMIZATION |
|---|---|---|---|
| A 505 | INOUT | IN | INOUT ⇒ OUT |
| B 510 | INOUT | OUT | INOUT ⇒ IN |
| C 515 | INOUT | --- | WARNING/REMOVE |
| D 520 | IN | IN | WARNING/REMOVE |
| E 525 | IN | --- | WARNING/REMOVE |
| F 530 | OUT | OUT | WARNING/REMOVE |
| G 535 | OUT | --- | WARNING/REMOVE |

| | INOUT | IN | OUT | OPTIMIZATION |
|---|---|---|---|---|
| A 505 | 1 | ≥1 | 0 | INOUT ⇒ OUT |
| B 510 | 1 | 0 | ≥1 | INOUT ⇒ IN |
| C 515 | 1 | 0 | 0 | WARNING/REMOVE |
| D 520 / E 525 | 0 | ≥1 | 0 | WARNING/REMOVE |
| F 530 / G 535 | 0 | 0 | ≥1 | WARNING/REMOVE |

OPTIMIZING RUNTIME COMMUNICATION PROCESSING BETWEEN SIMULATORS

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

NOTICE OF RELATED APPLICATIONS

A separate application includes subject matter that may be related to the present application herein. The potentially related pending application is entitled, "Automated Design Partitioning", application Ser. No. 009/139,156, filed on Aug. 24, 1998, and is incorporated herein by reference.

BACKGROUND OF THE INVENTION

1. Field of the Invention

The invention relates generally to the field of electronic simulation tools and Electronic Design Automation (EDA). More particularly, the invention relates to a mechanism for increasing runtime performance in a co-/ multi-simulation environment by reducing the number of connections between simulators and/or by reducing traffic between simulators.

2. Description of the Related Art

A number of trends in the design verification market and technological factors are making it increasingly more desirable to be able to employ multiple simulation tools on the same design. For instance, simulation tools are becoming increasingly more specialized while the number of simulation products is steadily growing. Additionally, the simulation task is becoming more decentralized as designers of all types of electronic products are using simulation at every phase of the design process, from analyzing tradeoffs during early architectural analysis, through detailed design of digital and analog circuits to optimize performance and power dissipation, to verification of hardware and firmware for complete system emulation and test. Moreover, design complexity and design diversity are increasing and each design technology (e.g., IC design, board design, and system design) tends to have its own simulation tools, models and vendors. Therefore, a typical design process may incorporate multiple tools from multiple vendors.

Co-simulation, the verification of a design using two simulators concurrently in a simulation session is advantageous to designers in many ways. For example, by employing co-simulation techniques, a designer that is familiar with a particular simulator, such as Verilog-XL, may gain the benefits of additional simulation algorithms, such as Synopsys/EPIC's TimeMill and/or IKOS's NSIM, without leaving the Verilog environment. Additionally, in theory, designers gain the freedom to choose the best verification tools for each task during the design process.

Figure 1A:
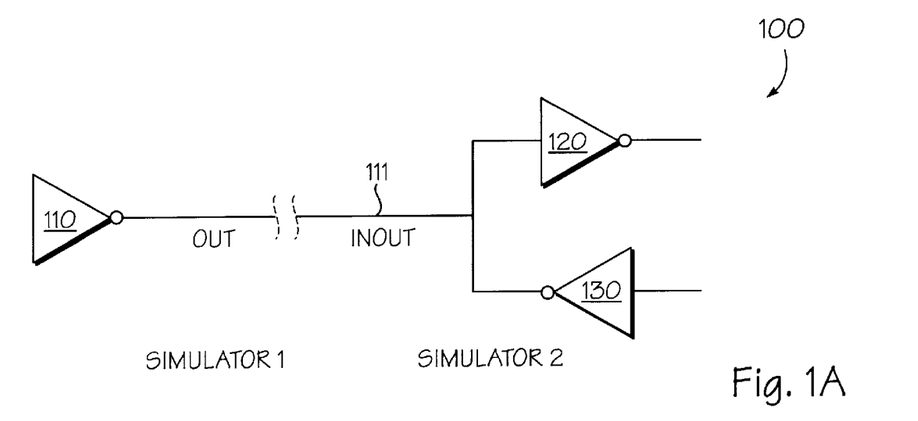
FIGS. 1A and 1B illustrate simplified examples of design partitions that are mishandled by existing co-simulation technology.
Figure 1B:
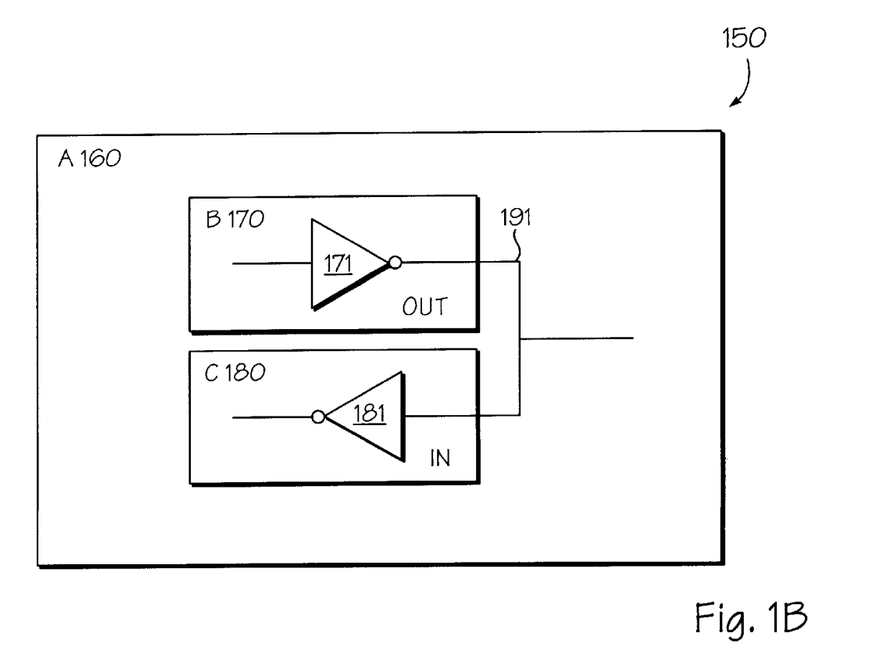

However, existing co-simulation solutions have several shortcomings. By way of example, FIGS. 1A and 1B illustrate simplified examples of design partitions that are mishandled by existing co-simulation technology. In the exemplary partitioned design 100 of FIG. 1A, a first gate 110 has been partitioned to simulator 1 while a second gate 120 and a third gate 130 have been assigned to simulator 2. The output of gate 110 traverses the boundary between simulator 1 and 2, therefore the net 111 associated with the output of gate 110 is labeled as "OUT" in the partition associated with simulator 1. However, net 111 is labeled as "INOUT" in the partition associated with simulator 2 since it is associated with both the input of gate 120 and the output of gate 130. During simulation, when the state of net 111 changes, as a result of the output of gate 110, the simulation environment stops both simulator 1 and simulator 2, synchronizes them in time, transfers information regarding the state change to simulator 2, and then restarts each simulator. Similarly, when the state of net 111 changes, as a result of the output of gate 130, the overhead of starting and stopping simulation must be incurred. Therefore, even though there are no receivers on the boundary net in the partition being simulated by simulator 1, the simulation processing of simulator 1 will unnecessarily be interrupted each time gate 130 causes the state of net 111 to change.

Referring now to FIG. 1B, another example is illustrated in which unnecessary synchronizations occur in the prior art. Design 150 has been partitioned into three partitions: A 160, B 170, and C 180. Partition A 160 includes partition B 170, partition C 180, and a net 191 that is visible in all three partitions 160, 170, and 180. Since the net 191 is coupled to the output of gate 171, the direction associated with the net 191 in partition B 170 is "OUT." The net 191 is coupled to the input of gate 181 in partition C 180; therefore, the direction associated with the net 191 at partition C 180 is "IN." During simulation, when the state of net 191 changes, as a result of the output of gate 171, the simulation environment stops each of the solvers that are simulating partitions coupled by net 191. In this example, therefore, the simulation environment stops the solvers that are simulating partition A 160, B 170, and C 180, synchronizes them in time, transfers information regarding the state change, and then restarts each solver. As in the example of FIG. 1A, even though there are no receivers in partition A 160 for the output of gate 171, prior art simulation processing unnecessary interrupts the solver by which partition A 160 is being simulated.

The unnecessary interruptions caused by the extra connections between partitions, such as those described above, result in an inefficient and more time consuming simulation of a partitioned design. Additionally, the retention of unnecessary connections between simulators by prior co-simulation solutions, wastes memory resources and results in diminished capacity for simulating more complex designs.

In light of the foregoing, what is needed is a simulation solution that reduces the occurrence of simulator synchronizations by eliminating unnecessary connections between simulators.

BRIEF SUMMARY OF THE INVENTION

An optimization mechanism for increasing runtime performance in a co-/ multi-simulation environment by reducing the number of connections between simulators is described. According to one aspect of the present invention, synchronizations among a first solver and one or more other solvers that are simulating a design of a system or a portion thereof are limited to situations in which simulation being performed by each of the one or more other solvers is dependent upon event information from the first solver. Partitioned design source information is received for each a plurality of solvers. Based upon the partitioned design source information, partition dependency information is generated. The partition dependency information includes information from which it may be verified whether or not one design partition is dependent upon an event from another design partition. Each of the plurality of solvers concurrently simulate the design by acting on a partition of the design. Responsive to event information provided by a first solver of the plurality of solvers, one or more other solvers are synchronized based upon the partition dependency information. Advantageously, in this manner, synchronizations among the solvers are limited to situations in which simulation being performed is dependent upon event information from another solver, thereby increasing runtime performance by avoiding unnecessary synchronizations during the simulation session.

Other features of the present invention will be apparent from the accompanying drawings and from the detailed description which follows.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A mechanism for reducing the number of connections between simulators is described. According to various embodiments of the present invention, communication processing among simulators is optimized. Briefly, as one feature of the present invention, netlist optimization logic is provided that analyzes netlists associated with partitions of a design that have been allocated to a plurality of solvers. Based upon a set of rules, the netlist optimization logic produces optimized boundary net information and/or netlist information which may subsequently be used to reduce runtime synchronization during a simulation session. For example, the optimized boundary net information may be employed by a simulation backplane to limit synchronizations among simulators to those simulators whose partitions actually depend upon boundary event information generated by another simulator's partition. In one embodiment, the netlist optimization logic optimizes directions associated with boundary nets for each of the partitions the boundary nets connect. According to another embodiment, solvers that do not need to participate in a boundary net (e.g., those having no receivers or drivers on the net) may be removed. Advantageously, by removing unnecessary nets, the capacity of the simulation session is expanded to handle larger and more complex designs.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be embodied in machine-executable instructions, which may be used to cause a general-purpose or special-purpose processor programmed with the instructions to perform the steps or may be performed by hardware components. Alternatively, the steps may be performed by a combination of hardware and software. Importantly, while embodiments of the present invention will be described with reference to design simulation using a simulation backplane, such as the SimMatrix™ electrical simulation backplane, the netlist optimization technologies described herein are equally applicable to other types of simulation environments (SimMatrix is a trademark or registered trademark of Mentor Graphics Corporation headquartered in Wilsonville, Oreg.).

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Terminology

Before describing an exemplary simulation environment in which various embodiments of the present invention may be implemented, some terms that will be used throughout this application will briefly be defined.

A "design" is defined as a description of a collection of objects which represent an electrical circuit.

The fundamental design structure for storing elements of a design will be referred to as a "cell", a "module", or a "design block." Cells may contain references to other cells as well as property information associated with the cell. The realization of a specific case of a cell is called a cell instance or simply an instance. Each cell instance has a set of "ports" that are used for connecting to other cell instances through "nets."

"Co-simulation" is the use of two simulators to verify a design, while "N-way co-simulation" or "multi-simulation" refer to the use of a simulation backplane and two or more simulators to verify a design.

A "simulation backplane" is a set of procedures, protocols, and functions that define the activities and structure of the simulation environment.

A "solver" is an instance of a simulator that is used in a simulation session. Multiple instances of a given simulator may be active at one time during a simulation session.

Partitioning a design involves specifying the design blocks that are to be simulated by the available solvers. The portion of a design that will be simulated by a particular solver is referred to as a "partition." Partitions that have components of multiple levels of hierarchy or are disjoint are still called a single partition. Typically a solver simulates one partition, which may be made up of one or more design blocks.

A "boundary event" is an event that occurs on a "boundary net" (also referred to as a "mixed-net"), a net (e.g., a wire) in the design that crosses between two solvers. Depending upon the synchronization algorithm employed, the simulation backplane may synchronize solvers upon the occurrence of boundary events.

The format in which a design or a partition of a design being simulated is epresented is referred to as a "design language" or a "design representation." A design representation may be thought of conceptually as any storage mechanism which contains design information and allows extraction of information relevant to the design. In order to simulate a design or portion of a design, the portion of the design being simulated must typically be written in a design representation that is usable by the simulator to which that portion of the design is partitioned. The design representation format in which the overall design being simulated is represented will be referred to herein as the design source representation. Simulators that are capable of extracting the design from the design source representation will be referred to as a "design source simulators," while simulators that cannot use the design source representation will be referred to as "non-design source simulators" or "client simulators." The logical collection of files, databases, memory, and/or other data structures that contain the design source representation will be referred to collectively as the design source.

The one or more data structures and/or files that list and/or describe the components in a design and how they are interconnected, in a design representation upon which a simulator may operate, are collectively referred to as a "netlist."

An Exemplary Simulation Environment

Figure 2:
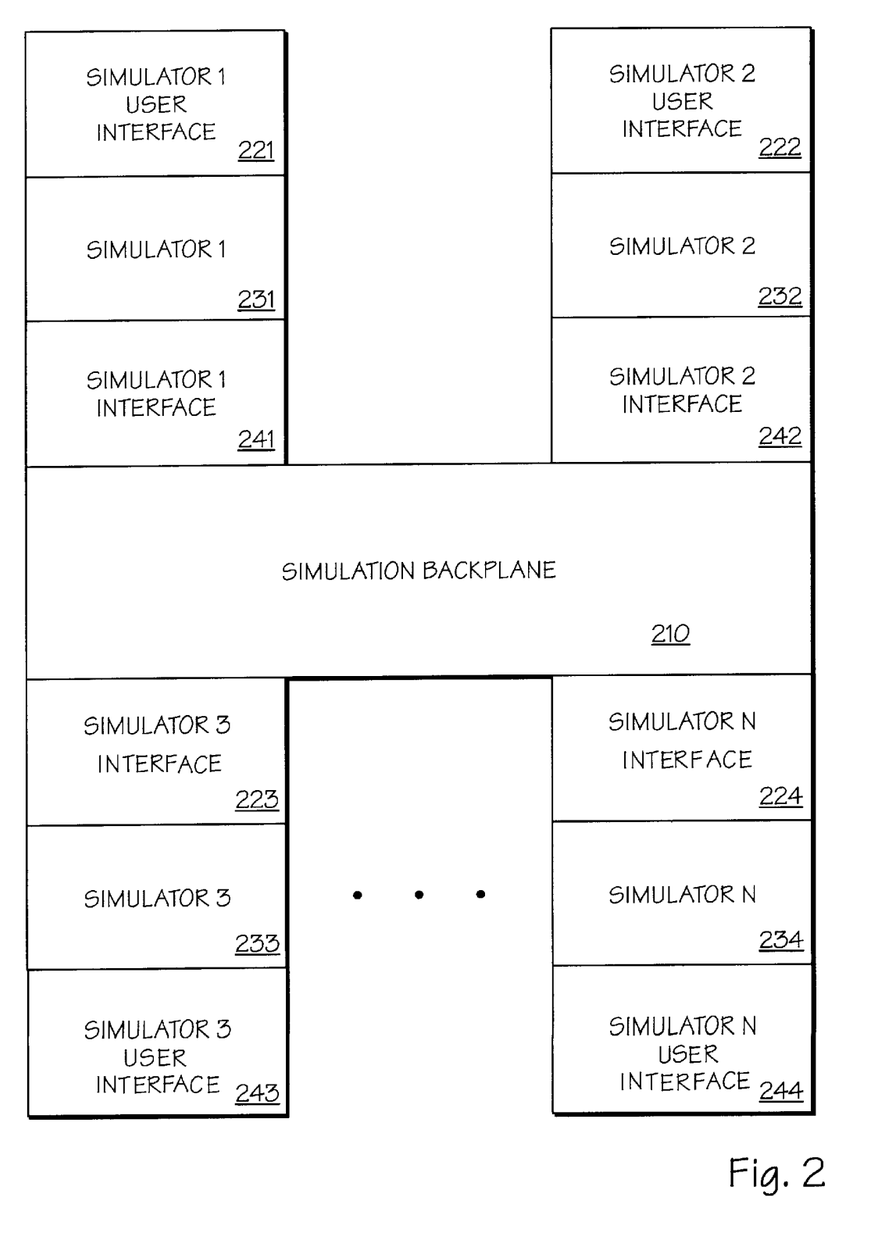
FIG. 2 conceptually illustrates the N-way co-simulation paradigm.

FIG. 2 conceptually illustrates the N-way co-simulation paradigm. A simulation backplane 210, such as the SimMatrix electrical simulation backplane available from Mentor Graphics Corporation, is coupled to a plurality of simulators 231–234 through their respective interfaces 241–244. The simulator interfaces 241–244 each expose a standard set of interface routines for performing functions such as initializing the simulator, performing netlist generation, e.g., writing cell descriptions, parsing netlists assigned to the simulator, registering boundary events, performing data type conversions, notifying the simulation ackplane 210 when boundary events occur, and other functions to facilitate simulation. The simulation backplane 210 defines the simulation environment 200 by way of a set of procedures, protocols and functions and coordinates the interaction among the simulators 231–234. For example, the simulation backplane 210 coordinates event transaction processing, state translation, event arbitration, and manages synchronization processing among the simulators 231–234. Synchronization is the point in the simulation session at which the simulators 231–234 and the simulation backplane 210 agree on the value of time. It is only during synchronization that boundary event information, such as states, currents, or voltages, can be reliably exchanged between simulators. The frequency of synchronizations during a simulation session is directly related to accuracy and performance; the more frequent the synchronizations, the higher the resulting accuracy (to a limit) and the lower the performance (without limit). When a boundary event occurs between simulators, the simulation backplane 210 synchronizes the simulators so that they are at the same point in time and, before transferring any event information, it converts the event information to a representation usable by the target simulator. In this manner, data is reliably exchanged between simulators.

Exemplary synchronization algorithms that may be employed include lockstep synchronization, look-ahead synchronization, optimistic synchronization, signal-based synchronization, and sync-interval synchronization. Lockstep is the oldest, most primitive, most conservative, universally accurate, but the slowest synchronization algorithm. In accordance with the lockstep synchronization algorithm, all simulators are synchronized within a certain fixed interval of time (e.g., every nanosecond). Look-ahead synchronization allows the simulators to execute asynchronously and synchronizes the simulators only when a boundary event occurs. The optimistic synchronization algorithm predicts the time of the next boundary event and simulates to that time. If an incoming boundary event occurs before the predicted time, then the optimistic simulator backtracks to the time of the boundary event. Signal-based synchronization allows synchronization to be triggered on clock or data ready lines, for example. The look-ahead, optimistic, and signal-based synchronization approaches reduce backplane overhead in situations in which communication between two cells is only important when a specific signal (event) occurs by synchronizing on a particular signal and/or a group of signals. Finally, sync-interval synchronization provides a user-programmable fixed time interval synchronization.

Exemplary Computer System

Figure 3:
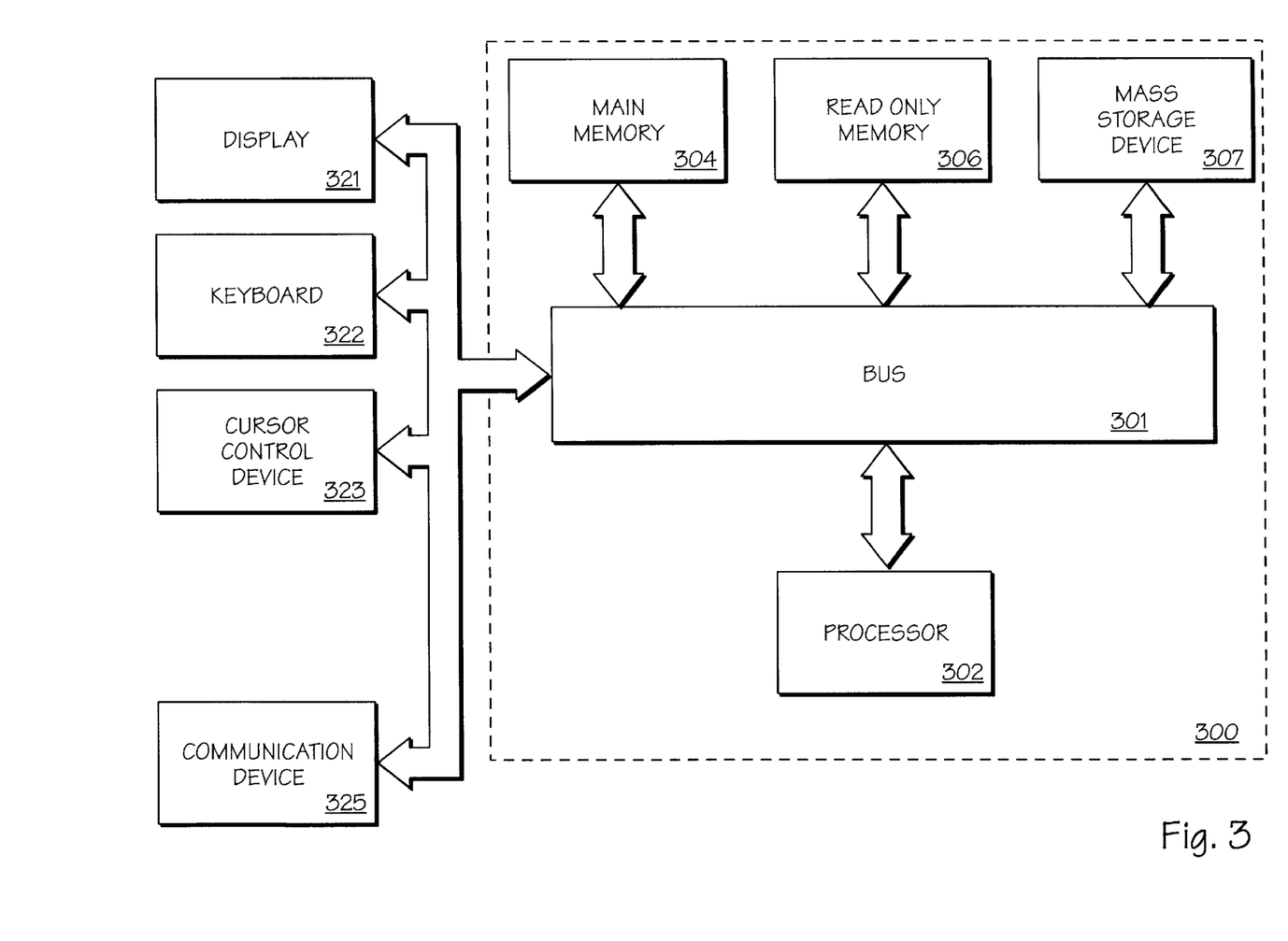
FIG. 3 is a simplified block diagram of a computer system in which various embodiments of the present invention may be implemented.

FIG. 3 is a block diagram illustrating an exemplary computer system 300 upon which one embodiment of the present invention may be implemented. Computer system 300 comprises a bus or other communication means 301 for communicating information, and a processing means such as processor 302 coupled with bus 301 for processing information. Computer system 300 further comprises a random access memory (RAM) or other dynamic storage device 304 (referred to as main memory), coupled to bus 301 for storing information and instructions to be executed by processor 302. Main memory 304 also may be used for storing temporary variables or other intermediate information during execution of instructions by processor 302. Computer system 300 also comprises a read only memory (ROM) and/or other static storage device 306 coupled to bus 301 for storing static information and instructions for processor 302.

A data storage device 307 such as a magnetic disk or optical disc and its corresponding drive may also be coupled to computer system 300 for storing information and instructions. Computer system 300 can also be coupled via bus 301 to a display device 321, such as a cathode ray tube (CRT) or Liquid Crystal Display (LCD), for displaying information to a computer user, such as signal names and transitions and values of various signals. Additionally, other graphical information may be presented to the user, such as a depiction of the loading and throughput for each simulator, the number of simulator synchronizations, an indication of the simulation session time, etc. Typically, an alphanumeric input device 322, including alphanumeric and other keys, may be coupled to bus 301 for communicating information and/or command selections to processor 302. Another type of user input device is cursor control 323, such as a mouse, a trackball, or cursor direction keys for communicating direction information and command selections to processor 302 and for controlling cursor movement on display 321.

A communication device 325 is also coupled to bus 301 in order to provide access to other attached computer systems, for example. The communication device 325 may include a modem, a network interface card (NIC), or other well known interface devices, such as those used for coupling to an Ethernet, token ring, or other types of networks. In any event, in this manner, the computer system 300 may be coupled to a number of clients and/or servers via a conventional network infrastructure, such as a company's Intranet and/or the Internet, for example, allowing distributed partition simulation.

Multi-Simulation Overview

Figure 4:
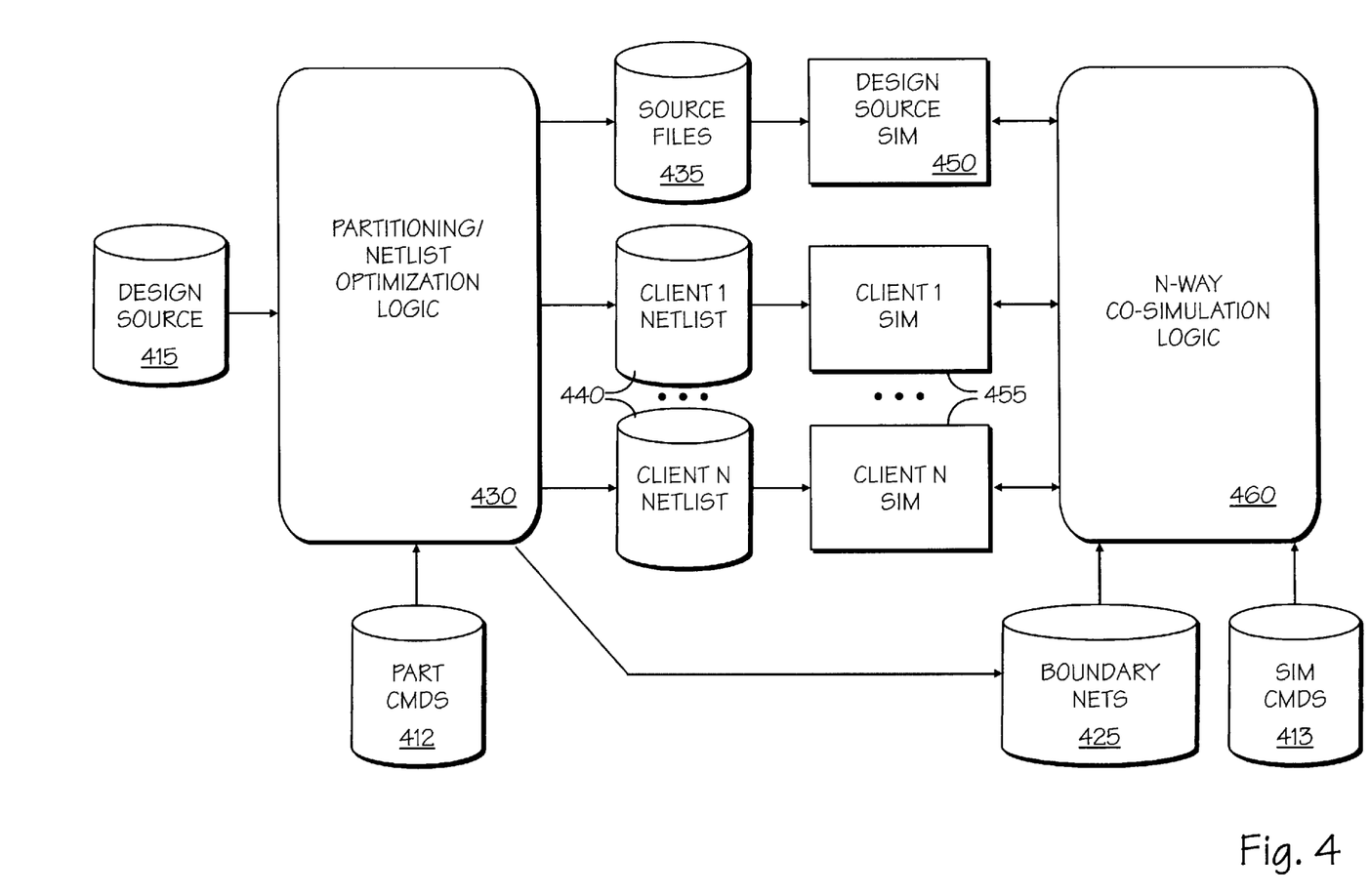
FIG. 4 is an overview of N-way co-simulation process according to one embodiment of the present invention.

Having described an exemplary computer system upon which one embodiment of the present invention may be implemented, a logical view of exemplary multi-simulation processing blocks and their interaction will now be described with reference to FIG. 4. Briefly, an overall design is initially available in the one or more design representations in which the design was developed, i.e., Verilog, QHDL, VHDL, Quicksim, etc. Importantly, "design representation" in this context is meant to broadly refer to any type of hardware description representation including those representations employed by schematic capture systems and the like. Segments or design blocks (also referred to as cells or modules) of the overall design may be allocated among multiple simulators by a manual or automated partitioning mechanism. Information, such as netlists, may be created in a design representation usable by the target simulators that lists and describes all the components in the respective portions of the design and indicates how they are interconnected. The netlists may then be processed by netlist optimization logic which reduces the number of connections between the target simulators and produces partition dependency information which may be used by the simulation backplane 210 to reduce the number of simulator synchronizations during the course of a simulation session.

In the embodiment depicted, for purposes of this overview, multi-simulation processing is conceptually divided into two functional units: partitioning/netlist optimization logic 430 and N-way co-simulation logic 460. The partitioning/netlist optimization logic 430 implements user-supplied partitioning rules (also referred to as partitioning commands or partitioning directives) to define which segments of the overall design are to be simulated by which simulator(s) 450, 455. The partitioning directives may be supplied by way of a separate file, such as the partitioning commands file 412 or they may be specified as annotations within the design source 415. According to one embodiment, the design source 415 may be partitioned among the simulators 450, 455 as disclosed in copending U.S. patent application Ser. No. 09/139,156, entitled "Automated Design Partitioning." In alternative embodiments, the design source 315 may be manually partitioned. In any event, for each design segment assigned to a particular simulator, a netlist or netlist-like information 435, 440 is generated in a format understood by the simulator 450, 455.

The partitioning/netlist optimization logic 430 also performs mixed-net filtering and net direction optimization on the partitioned design according to a set of predefined rules to reduce the number of connections between the target simulators. Depending upon the simulators participating in the simulation session, the optimization may be performed before or during runtime. A result of the optimization processing is a boundary nets database 425 which may be thought of conceptually as a list of boundary nets and, for each of the boundary nets, the solvers that are dependent upon events occurring on those boundary nets ("boundary events"). The boundary nets database 425 may then be consulted during runtime to determine which solvers need to be synchronized when boundary events occur. For example, when a boundary event occurs, the N-way co-simulation logic 460 may access the boundary nets database 425, locate the boundary net corresponding to the event, and synchronize all the solvers that are listed as dependent upon the boundary net upon which the event occurred. According to one embodiment of the present invention, unnecessary or redundant nets may be "removed" by eliminating references to those solvers that do not depend on the particular boundary event from the list of dependent solvers for the corresponding boundary net. In alternative embodiments, redundant nets may be physically removed from the netlists 440 and/or source files 435. Advantageously, in either case, solvers that do not depend upon particular boundary event information are allowed to continue their simulation without interruption and only those solvers that require the boundary event information for their simulation will receive it. In one embodiment, direction optimization is accomplished by associating directionality with the dependent solvers listed in the boundary nets database 425. In this manner, the directionality associated with particular solvers for certain boundary nets may be manipulated depending upon the directionality associated with the other dependent solvers as will be described further below.

The simulators 450, 455 operate upon their associated netlists to simulate their portion of the design during simulation. The N-way co-simulation logic 460 initializes the target simulators and coordinates boundary event information exchange among the simulators 450, 455 as will be described further below.

While in the embodiment illustrated, the partitioning directives and the simulation commands are shown as residing in separate data stores 412 and 413, this information may be combined into a single global design initialization file, placed in separate design block initialization files, or provided fully or in part via annotations in the design source 415.

Exemplary Netlist Optimization Rules

Before discussing a set of exemplary direction optimization rules, the concept of directionality of nets will now be described. Directionality in this context is determined from the perspective of the gate(s) in the local partition that are connected to the net without regard to the gate(s) outside of the local partition. Therefore, a net that is coupled only to one or more receivers (or listeners) in a particular partition is labeled as "IN" even though there may be no drivers outside the partition. Similarly, a net that is coupled only to one or more drivers in a particular partition is labeled as "OUT" even though there may be no receivers outside the partition. Those nets in a partition that are coupled to both receivers and drivers in the partition are labeled as "INOUT." Finally, those nets in a partition that are coupled to neither receivers nor drivers are labeled as "UNDEFINED" or "NONE."

Figure 5A:
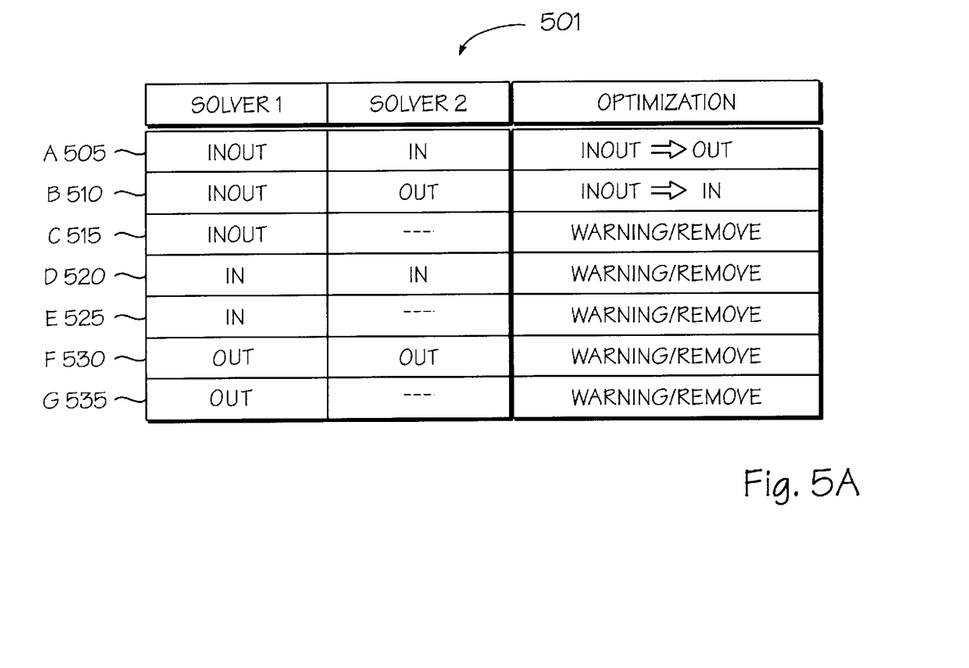
FIG. 5A illustrates an exemplary set of optimization rules that may be employed to reduce the occurrence of simulator synchronizations during runtime according to one embodiment of the present invention.

Referring now to FIG. 5A, an exemplary set of optimization rules that may be employed to reduce the occurrence of simulator synchronizations during runtime is described. For convenience, the directions listed in table 501 are from the perspective of the solvers. It is appreciated that the directions stored in the boundary nets database 425 may be from either the perspective of the simulation backplane 210 or from the perspective of the solvers. To change the perspective of table 501 from that of the solvers to the perspective of the simulation backplane 210, "IN" can be substituted for each occurrence of "OUT" and vice versa.

The exemplary rules illustrated by table 501 presuppose the existence of a boundary net connecting an instance of a cell of a partition assigned to a first solver to an instance of a cell of a partition assigned to a second solver. Additionally, the direction associated with each side of the boundary net has already been determined.

Optimization rule A 505 indicates if the first solver's side of the boundary net is "INOUT" (meaning at least one receiver and at least one driver are on the boundary net) and the second solver's side of the boundary net is "IN" (meaning only receivers are on the boundary net), then the direction associated with the first solver's side of the boundary net is changed to "OUT."

Optimization rule B 510 indicates if the first solver's side of the boundary net is "INOUT" and the second solver's side of the boundary net is "OUT" (meaning only drivers are on the boundary net), then the direction associated with the first solver's side of the boundary net is changed to "IN." In this manner, the N-way co-simulation logic 460 will not interrupt the second solver when intra-partition events are generated.

Optimization rule C 515 indicates if the first solver's side of the boundary net is "INOUT" and the second solver's side of the boundary net is "UNDEFINED" (meaning there are no drivers or receivers on the boundary net), then one or both of the solvers may be removed from the list of solvers that are dependent upon the boundary net or the boundary net may be excluded from the netlist information during netlist generation.

Optimization rule D 520 indicates if the first solver's side of the boundary net is "IN" and the second solver's side of the boundary net is "IN," then one or both of the solvers may be removed from the list of solvers that are dependent upon the boundary net or the boundary net may be excluded from the netlist information during netlist generation.

Optimization rule E 525 indicates if the first solver's side of the boundary net is "IN" and the second solver's side of the boundary net is "UNDEFINED," then one or both of the solvers may be removed from the list of solvers that are dependent upon the boundary net or the boundary net may be excluded from the netlist information during netlist generation.

Optimization rule F 530 indicates if the first solver's side of the boundary net is "OUT" and the second solver's side of the boundary net is "OUT," then one or both of the solvers may be removed from the list of solvers that are dependent upon the boundary net or the boundary net may be excluded from the netlist information during netlist generation.

Optimization rule G 535 indicates if the first solver's side of the boundary net is "OUT" and the second solver's side of the boundary net is "UNDEFINED," then one or both of the solvers may be removed from the list of solvers that are dependent upon the boundary net or the boundary net may be excluded from the netlist information during netlist generation. Advantageously, the optimization rules providing for removal of unnecessary nets provide more capacity to handle more complex designs without increasing the memory requirements of the system.

Figure 5B:
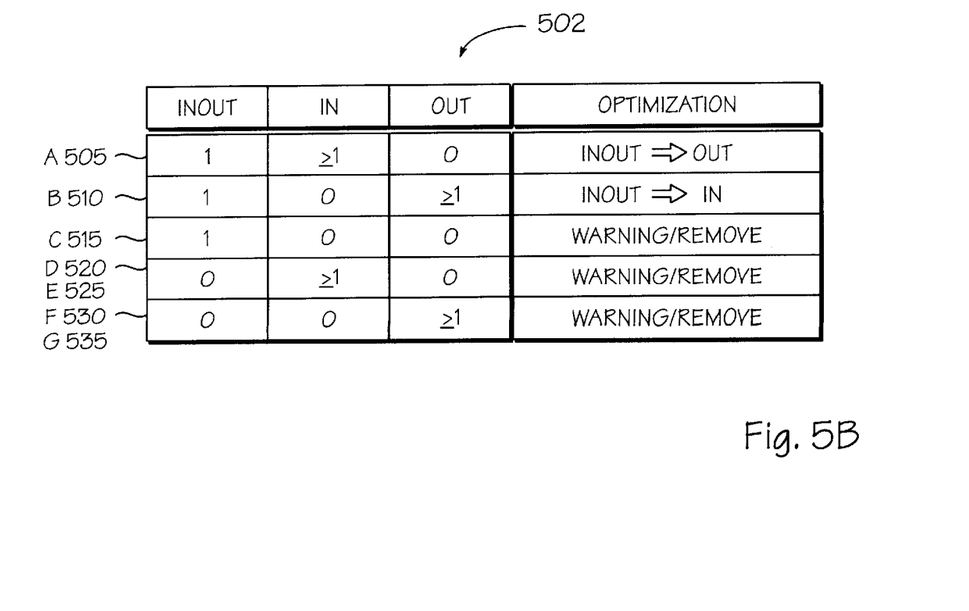
FIG. 5B illustrates a generalization of the optimization rules of FIG. 5A for N solvers.

Optimization rules A 505 through G 535 of FIG. 5B illustrate generalizations of the optimization rules of FIG. 5A for N solvers. The numbers in table 502 indicate the number of partitions connected through a boundary net that have a particular directionality. According to rule A 505, if only a single partition is "INOUT" and the remainder of the coupled partitions are "IN," then the directionality of the single partition may be optimally be expressed as "OUT."

According to rule B 510, if only a single partition is "INOUT" and the remainder of the coupled partitions are "OUT," then the directionality of the single partition may be optimally expressed as "IN."

According to rule C 515, if only a single partition is "INOUT" and the remainder of the coupled partitions are "UNDEFINED," then all of the solvers may be removed from the list of solvers that are dependent upon this boundary net or the boundary net may be excluded from the netlist information during netlist generation.

According to rule D 520 and rule E 525 (which collapse to one rule), if the partitions are all "IN," then all of the solvers may be removed from the list of solvers that are dependent upon this boundary net or the boundary net may be excluded from the netlist information during netlist generation.

According to rule F 530 and rule G 535 (which collapse to one rule), if the partitions are all "OUT," then all of the solvers may be removed from the list of solvers that are dependent upon this boundary net or the boundary net may be excluded from the netlist information during netlist generation.

Exemplary Design Partitions which may be Improved

Figure 6A:
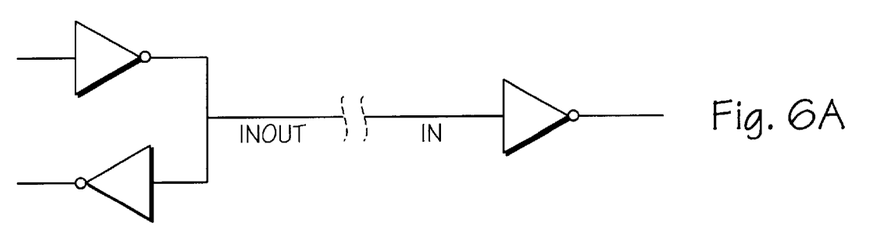
FIGS. 6A–G represent exemplary design partitions which may be more efficiently represented for purposes of co-/multi-simulation with the optimization rules of FIGS. 5A and 5B.

FIG. 6A represents an exemplary design partition which may be more efficiently represented for purposes of co-/multi-simulation with optimization rule A 505 of FIGS. 5A and 5B.

Figure 6B:
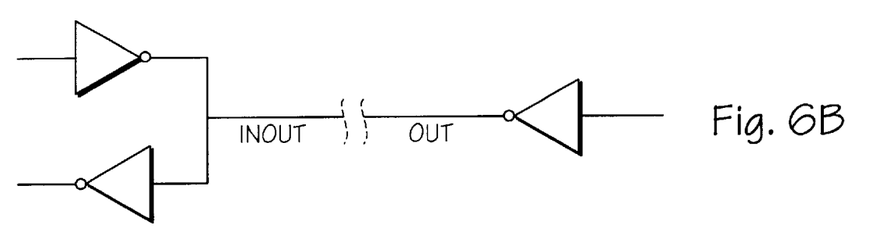

FIG. 6B represents an exemplary design partition which may be more efficiently represented for purposes of co-/multi-simulation with optimization rule B 510 of FIGS. 5A and 5B.

Figure 6C:
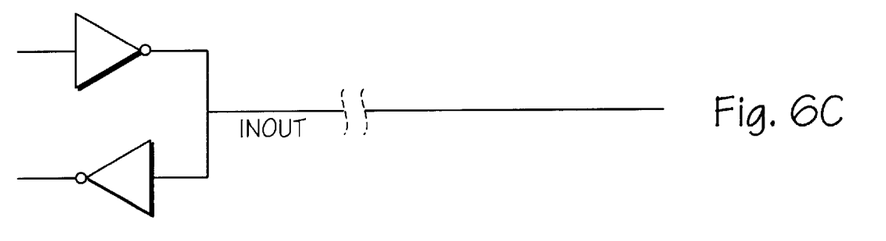

FIG. 6C represents an exemplary design partition which may be more efficiently represented for purposes of co-/multi-simulation with optimization rule C 515 of FIGS. 5A and 5B.

Figure 6D:
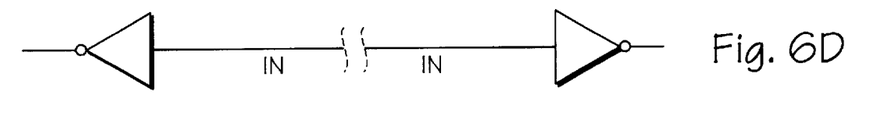

FIG. 6D represents an exemplary design partition which may be more efficiently represented for purposes of co-/multi-simulation with optimization rule D 520 of FIGS. 5A and 5B.

Figure 6E:
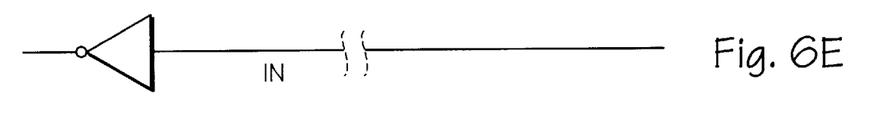

FIG. 6E represents an exemplary design partition which may be more efficiently represented for purposes of co-/multi-simulation with optimization rule E 525 of FIGS. 5A and 5B.

Figure 6F:
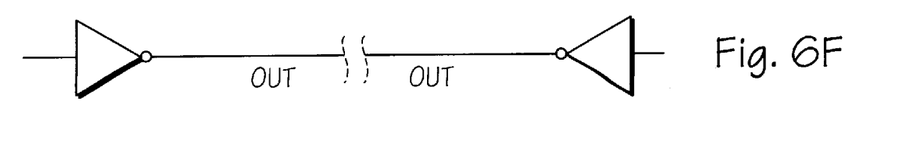

FIG. 6F represents an exemplary design partition which may be more efficiently represented for purposes of co-/multi-simulation with optimization rule F 530 of FIGS. 5A and 5B.

Figure 6G:
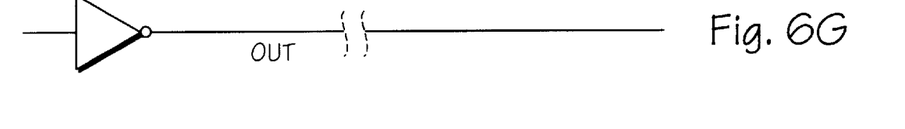

FIG. 6G represents an exemplary design partition which may be more efficiently represented for purposes of co-/ multi-simulation with optimization rule G 535 of FIGS. 5A and 5B.

Multi-Simulation Processing

Figure 7:
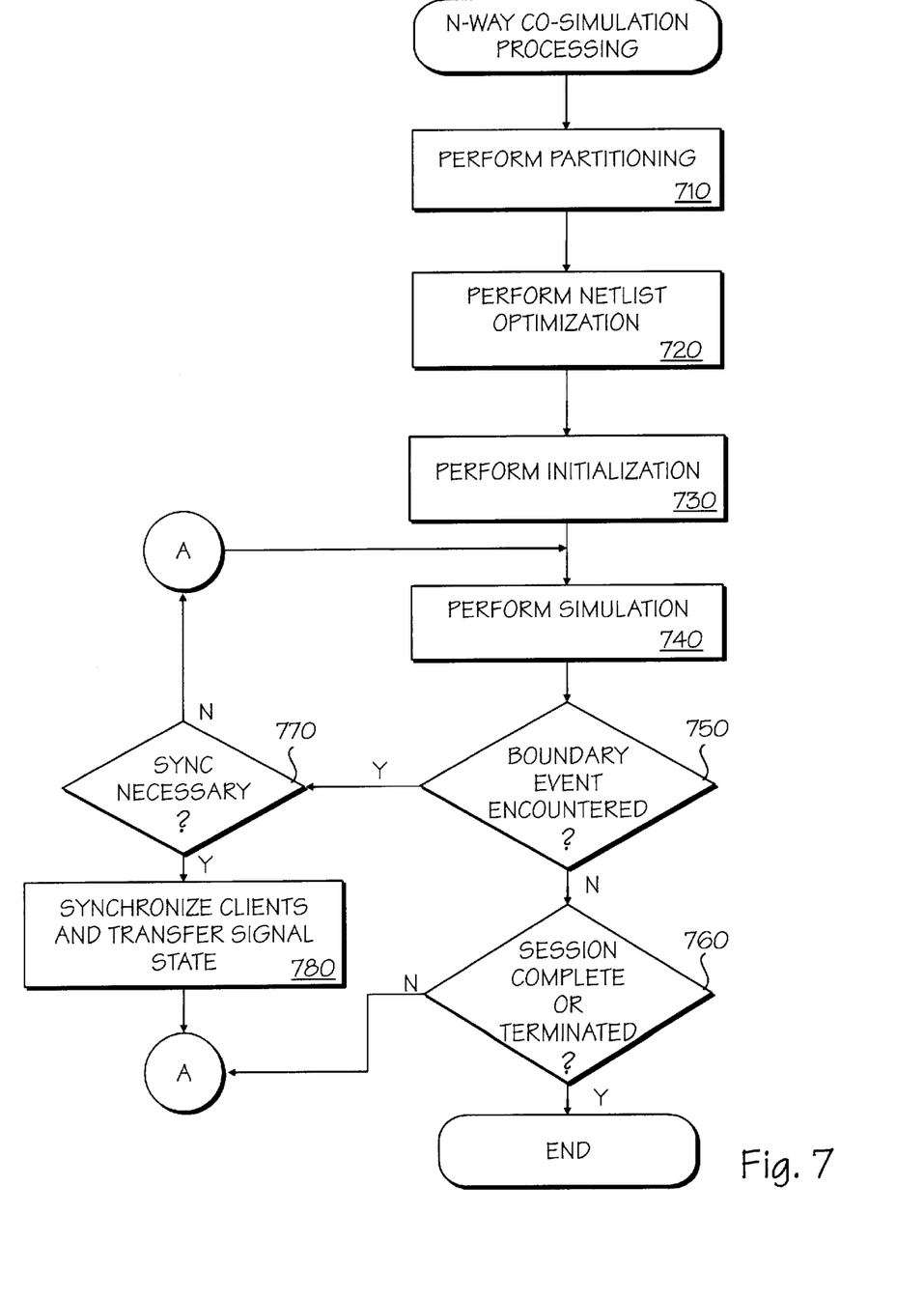
FIG. 7 is a flow diagram illustrating N-way co-simulation processing according to one embodiment of the present invention.

FIG. 7 is a flow diagram illustrating N-way co-simulation processing according to one embodiment of the present invention. The N-way co-simulation process generally breaks down into a partitioning stage, an optimization stage, an initialization stage, and a runtime stage. The partitioning stage is represented by step 710, the optimization stage is represented by step 720, the initialization stage is represented by step 730, and the runtime stage includes steps 740 through 780. Briefly, after partitioning, netlist optimization, and initialization are performed, the runtime stage may start up as a regular simulation session in the environment of the primary simulator, i.e., the simulator to which the top cell of the overall design has been partitioned. Then, when the simulation backplane 110 detects a boundary event corresponding to a design segment partitioned to another simulator, the simulation backplane 110 determines with which simulators, if any, synchronization is necessary with reference to partition dependency information generated as a result of the netlist optimization stage. If another simulator is "dependent" upon information relating to the boundary event for its simulation activities, then the simulation backplane 210 transfers information relating to the event and control of the simulation session to that simulator. In this context, one simulator is said to be dependent upon information relating to the boundary event of another when the simulator requires the information for its simulation. For example, in FIG. 1A, simulator 2 requires the output of gate 110 in order to correctly simulate the portion of the design assigned to it. However, simulator 1 is not dependent upon event information carried on boundary net 111. Similarly, in FIG. 1B, the simulator to which partition A 160 is assigned is not dependent upon event information carried on boundary net 191.

In one embodiment, the steps described below may be performed under the control of a programmed processor, such as processor 302. However, in alternative embodiments, the steps may be fully or partially implemented by any programmable or hardcoded logic, such as Field Programmable Gate Arrays (FPGAs), TTL logic, or Application Specific Integrated Circuits (ASICs), for example.

At step 710, the design source 415 is partitioned to create source files 435 and client netlists 440 for use by the design source simulator 450 and client simulators 455, respectively, during simulation.

At step 720, information regarding all boundary nets (mixed nets), e.g., those nets that cross partition boundaries, is accumulated and optimized netlist information (also referred to as partition dependency information and optimized direction information) is produced in the form of a boundary nets database 425, for example. Netlist optimization processing is described in detail below.

At step 730, the simulation backplane 210 performs initialization processing, including initializing the state of all nets. For example, the simulation backplane 210 may instruct each simulator to initialize its partition to some initial operating point, thereby resetting each simulator's notion of time to zero, releasing all forced values on probes, and initializing the state of every net. In digital simulators, the initial state of every net is usually defined by the simulator. However, for analog simulators, the initial state of every net results from finding a stable dc operating point for the circuit. Therefore, in the case of an analog circuit, each simulator may be instructed to perform at least one initialization cycle. Subsequently, the states of mixed nets at the end of the initialization may be exchanged between simulators. After any resultant state changes have been made and the dc solution settles, the simulation backplane 210 may begin to coordinate the simulation session. Finally, before starting simulation, the simulation backplane 210 may additionally load simulation-related commands from an initialization file, such as the simulation commands data store 413.

At step 740, the runtime stage begins. Each simulator that is participating in the simulation session, simulates those portions of the overall design that have been assigned to it until either a boundary event is encountered or until the session is completed or terminated.

When a simulator is simulating and it encounters a boundary net, it drives the net by forcing a new state on that net and passes the value to the simulation backplane 210. At step 750, it is determined whether or not a boundary event has occurred. If a boundary net has been encountered, then processing continues with step 770; otherwise processing continues with step 760.

At step 770, a determination is made whether or not one or more other simulators need to be synchronized as a result of the boundary event. This determination may be made with reference to the partition dependency information produced by the netlist optimization stage. If simulation of another partition depends up the event information associated with the boundary event, the processing continues with step 780; otherwise simulation processing continues with step 740.

At step 780, the simulation backplane 210 synchronizes only those of the simulators that are associated with partitions that are dependent upon the event information. This enables data to be reliably and efficiently exchanged between simulators that require the event information. Various synchronization algorithms were described above. In addition to synchronizing the simulators, the simulation backplane 210 also performs data type conversion and transfers boundary event information, such as signal state. Signal state representation, while consistent within any one particular simulator, varies between diverse simulators. Therefore, before transferring the signal state from the source simulator to one or more target simulators, signal mapping (also referred to as data type conversion) is performed between the source and target representations in order to achieve consistent signal state representations. Exemplary conversions include the point-to-point signal mapping or mapping to intermediate simulation backplane types. Point-to-point signal mapping directly maps a data type associated with the source simulator to a data type associated with the target simulator. Mapping to intermediate simulation backplane types involves mapping from a data type associated with the source simulator to an intermediate abstract type associated with the simulation backplane 210 followed by a mapping from the intermediate abstract type to a data type associated with the target simulator. Either conversion mechanism may be implemented with a user-programmable state translation table.

After any necessary data type conversion has been performed the boundary event information may be transferred. The communication channel, the mechanism used to gather and transfer boundary event information, varies from one simulator to another. For example, the transfer may occur through direct memory transfer (e.g., subroutine or shared memory implementation), or through inter-process communication. In any event, after the source and target simulators have been synchronized and the boundary event information has been transferred, simulation processing continues at step 740.

At step 760, a determination is made whether the simulation session has been completed or has been terminated. Completion may be determined by comparison of the design simulation time to some stop time set by the designer while termination is typically the abrupt unscheduled halting of the execution either asynchronously initiated by the designer or asynchronously initiated by the operation system or other master controlling program, for example. If neither condition has occurred then simulation processing continues at step 740; otherwise simulation processing is complete.

Netlist Optimization Processing

Figure 8:
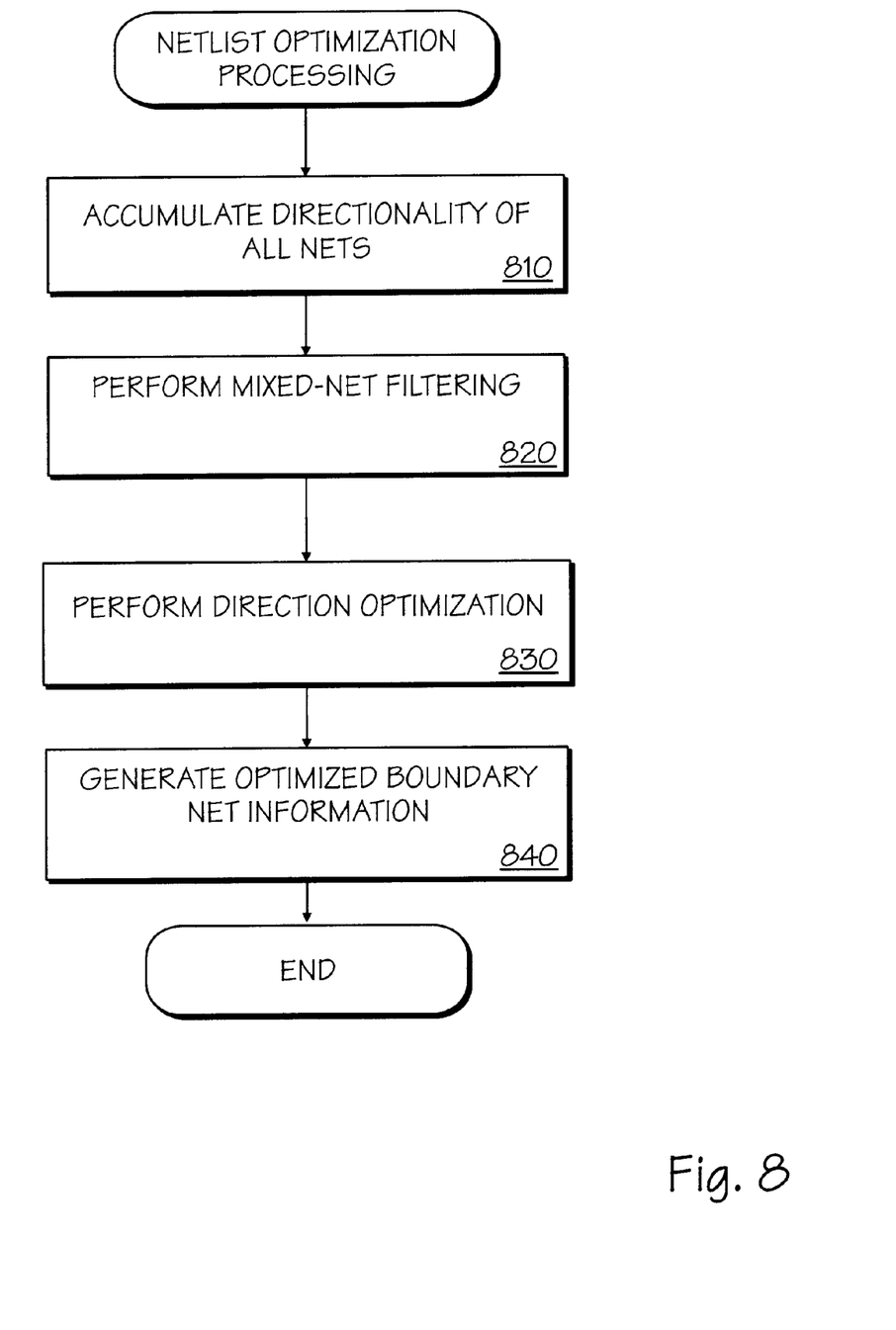
FIG. 8 is a flow diagram illustrating netlist optimization processing according to one embodiment of the present invention.

FIG. 8 is a flow diagram illustrating netlist optimization processing according to one embodiment of the present invention. At step 810, the directionality of all boundary nets is accumulated. According to one embodiment, the partitioned design source information may be traversed to leaf-level cell instances at which point receivers and drivers are counted. Nets with one or more receivers and no drivers connected to them are labeled as "IN." Nets with one or more drivers and no receivers are labeled as "OUT." Nets with one or more drivers and one or more receivers are labeled as "INOUT." Nets with no connected drivers and no connected receivers are "UNDEFINED."

At step 820, mixed-net filtering is performed. According to one embodiment, filtering is the process of removing/excluding redundant/unnecessary nets from the netlist information during netlist generation. In alternative embodiments, the redundant nets may be included in the netlist information, but effectively removed by manipulating the partition dependency information in the boundary nets database 425, for example.

At step 830, direction optimization is performed. Based upon the directionality of the boundary nets accumulated at step 810 and the optimization rules described above, the partition dependency information, stored in the boundary nets database 425, for example, is optimized so as to reduce unnecessary runtime synchronizations.

At step 840, the results of the mixed-net filtering and direction optimization are stored so as to be available during runtime.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising the steps of:

reading a design source upon which a first simulator may operate, the design source defining a plurality of cells representing a design of a system or a portion thereof;

identifying two or more instances of a cell where one subset of instances containing at least one instance but not all of the cell's instances is assigned to a first solver of a plurality of solvers and a second subset of instances is assigned to a second solver of the plurality of solvers and the contents of another instance of the cell are assigned differently to a third solver of the plurality of solvers based upon a set of partitioning rules;

generating edited design source corresponding to a partition to be simulated by the first solver and netlist information in a format understood by the second solver, the edited design source including a modified cell description of a parent cell with which the cell is associated;

accumulating directions associated with boundary nets based upon corresponding netlist information, each boundary net having a direction associated with each design partition it connects;

for those of the boundary nets that satisfy a rule of a set of rules, determining optimized direction information based upon the rule; and responsive to event information provided by the first solver, synchronizing one or more other solvers of the plurality of solvers based upon the optimized direction information, whereby synchronizations among the first solver and the one or more other solvers are limited to situations in which simulation being performed by each of the one or more other solvers is dependent upon the event information.

2. The method of claim 1, wherein a boundary net couples a first design partition being simulated by the first solver and a second design partition being simulated by the second solver, and wherein the set of rules includes one or more of the following rules:

if the direction of the boundary net at the first design partition is "INOUT" and the direction of the boundary net at the second design partition is "IN", then change the direction of the boundary net at the first design partition to "OUT" in the optimized direction information;

if the direction of the boundary net at the first design partition is "INOUT" and the direction of the boundary net at the second design partition is "OUT", then change the direction of the boundary net at the first design partition to "IN" in the optimized direction information;

if the direction of the boundary net at the first design partition is "IN" and the direction of the boundary net at the second design partition is "IN", then remove the boundary net from the optimized direction information;

if the direction of the boundary net at the first design partition is "OUT" and the direction of the boundary net at the second design partition is "OUT", then remove the boundary net from the optimized direction information; and if the direction of the boundary net at the first design partition is "UNDEFINED", then remove the boundary net from the optimized direction information.

3. A machine-readable medium having stored thereon data representing sequences of instructions, the sequences of instructions which, when executed by a processor, cause the processor to perform the steps of:

reading a design source upon which a first simulator may operate, the design source defining a plurality of cells representing a design of a system or a portin thereof;

identifying two or more instances of a cell where one subset of instances containing at least one instance but not all of the cell's instances is assigned to a first solver of a plurality of solvers and a second subset of instances is assigned to a second solver of the plurality of solvers and the contents of another instance of the cell are assigned differently to a third solver of the plurality of solvers based upon a set of partitioning rules;

generating edited design source corresponding to a partition to be simulated by the first solver and netlist information in a format understood by the second solver, the edited design source including a modified cell description of a parent cell with which the cell is associated;

accumulating directions associated with boundary nets based upon corresponding netlist information, each boundary net having a direction associated with each design partition it connects;

for those of the boundary nets that satisfy a rule of a set of rules, determining optimized direction information based upon the rule; and responsive to event information provided by the first solver, synchronizing one or more other solvers of the plurality of solvers based upon the optimized direction information, whereby synchronzations among the first solver and the one or more other solvers are limited to situations in which simulation being performed by each of the one or more other solvers is dependent upon the event information.

4. The machine-readable medium of claim 3, wherein a boundary net couples a first design partition being simulated by the first solver and a second design partition being simulated by the second solver, and wherein the set of rules includes one or more of the following rules:

if the direction of the boundary net at the first design partition is "INOUT" and the direction of the boundary net at the second design partition is "IN", then change the direction of the boundary net at the first design partition to "OUT" in the optimized direction information;

if the direction of the boundary net at the first design partition is "INOUT" and the direction of the boundary net at the second design partition is "OUT", then change the direction of the boundary net at the first design partition to "IN" in the optimized direction information;

if the direction of the boundary net at the first design partition is "IN" and the direction of the boundary net at the second partition is "IN", then remove the boundary net from the optimized direction information;

if the direction of the boundary net at the first partition is "OUT" and the direction of the boundary net at the second design parition is "OUT", then remove the boundary net from the optimized direction information; and if the direction of the boundary net at the first design partition is "UNDEFINED", then remove the boundary net from the optimized direction information.

* * * * *